(12) United States Patent
Sharma et al.

(10) Patent No.: US 11,031,503 B2
(45) Date of Patent: Jun. 8, 2021

(54) NON-PLANAR GATE THIN FILM TRANSISTOR

(71) Applicant: Intel Corporation, Santa Clara, CA (US)

(72) Inventors: Abhishek A. Sharma, Hillsboro, OR (US); Van H. Le, Portland, OR (US); Gilbert Dewey, Beaverton, OR (US); Rafael Rios, Austin, TX (US); Jack T. Kavalieros, Portland, OR (US); Yih Wang, Portland, OR (US); Shriram Shivaraman, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/329,044

(22) PCT Filed: Sep. 27, 2016

(86) PCT No.: PCT/US2016/054014
§ 371 (c)(1),
(2) Date: Feb. 27, 2019

(87) PCT Pub. No.: WO2018/063165
PCT Pub. Date: Apr. 5, 2018

(65) Prior Publication Data
US 2019/0198675 A1    Jun. 27, 2019

(51) Int. Cl.
*H01L 29/66* (2006.01)
*H01L 29/786* (2006.01)
(Continued)

(52) U.S. Cl.
CPC ...... *H01L 29/78642* (2013.01); *H01L 21/768* (2013.01); *H01L 21/76802* (2013.01);
(Continued)

(58) Field of Classification Search
CPC ............. H01L 29/78642; H01L 21/768; H01L 21/76802; H01L 23/50; H01L 29/66742
(Continued)

(56) References Cited

U.S. PATENT DOCUMENTS 5,506,421 A * 4/1996 Palmour ............ H01L 29/7813
257/77
8,614,479 B2 * 12/2013 Weng ................. H01L 51/0554
257/302

(Continued)

OTHER PUBLICATIONS

International Search Report and Written Opinion dated Jun. 7, 2017 for International Application No. PCT/US2016/054014, 14 pages.

*Primary Examiner* — Tan N Tran
(74) *Attorney, Agent, or Firm* — Schwabe, Williamson & Wyatt, P.C.

(57) ABSTRACT

Embodiments of the present disclosure describe a non-planar gate thin film transistor. An integrated circuit may include a plurality of layers formed on a substrate, and the plurality of layers may include a first one of a source or drain, an inter-layer dielectric (ILD) formed on the first one of the source or drain, and a second one of the source or drain formed on the ILD. A semiconductive layer may be formed on a sidewall of the plurality of layers. A gate dielectric layer formed on the semiconductive layer, and a gate may be in contact with the gate dielectric layer.

22 Claims, 10 Drawing Sheets

(51) Int. Cl.
*H01L 21/768* (2006.01)
*H01L 23/50* (2006.01)

(52) U.S. Cl.
CPC ........ *H01L 23/50* (2013.01); *H01L 29/66742* (2013.01); *H01L 2224/16225* (2013.01); *H01L 2924/15311* (2013.01)

(58) Field of Classification Search
USPC ........................................................ 257/329
See application file for complete search history.

(56) References Cited

U.S. PATENT DOCUMENTS

| | | | | |
|---|---|---|---|---|
| 8,890,119 | B2* | 11/2014 | Doyle | H01L 29/42376 |
| | | | | 257/24 |
| 9,177,872 | B2* | 11/2015 | Sandhu | H01L 21/8254 |
| 2013/0341702 | A1 | 12/2013 | Kar et al. | |
| 2014/0197462 | A1* | 7/2014 | Briere | H01L 29/0653 |
| | | | | 257/194 |
| 2015/0060943 | A1* | 3/2015 | Motonobu | H01L 29/205 |
| | | | | 257/192 |
| 2015/0270374 | A1 | 9/2015 | Nyhus et al. | |
| 2016/0163729 | A1 | 6/2016 | Zhang et al. | |
| 2016/0181270 | A1 | 6/2016 | Lee | |

* cited by examiner

NON-PLANAR GATE THIN FILM TRANSISTOR

CROSS REFERENCE TO RELATED APPLICATIONS

The present application is a national phase entry under 35 U.S.C. § 371 of International Application No. PCT/US2016/054014, filed Sep. 27, 2016, entitled "NON-PLANAR GATE THIN FILM TRANSISTOR", which designated, among the various States, the United States of America, and which is hereby incorporated by reference.

FIELD

Embodiments of the present disclosure generally relate to the field of integrated circuits, and more particularly, to a non-planar gate thin film transistor.

BACKGROUND

A thin-film transistor (TFT) is a field-effect transistor that includes a thin film of a semiconductive material, a dielectric layer, and metal contacts over a supporting substrate (which may be non-conductive or semiconductive). The thin film of semiconductive material forms an active layer (e.g., a conductive channel) of the TFT. TFTs differ from other transistors, in which a semiconductor substrate, e.g., a silicon wafer, forms an active channel of the transistor. A TFT may be horizontally placed, e.g., in a planar TFT a semiconductive material may be formed on a substrate, and a gate dielectric and gate may be formed above the semiconductive material.

In some horizontally placed TFTs, a width of the transistor is increased to address a problem of limited drive current and the corresponding limited performance. However, increasing transistor width utilizes layout area and may not be acceptable for some applications, where a high density of packing is desired.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Embodiments of the present disclosure describe a non-planar gate thin film transistor. An integrated circuit may include a plurality of layers formed on a substrate, and the plurality of layers may include a first one of a source or drain, an inter-layer dielectric (ILD) formed on the first one of the source or drain, and a second one of the source or drain formed on the ILD. A semiconductive layer may be formed on a sidewall of the plurality of layers. A gate dielectric layer formed on the semiconductive layer, and a gate may be in contact with the gate dielectric layer.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, side, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

Figure 1:
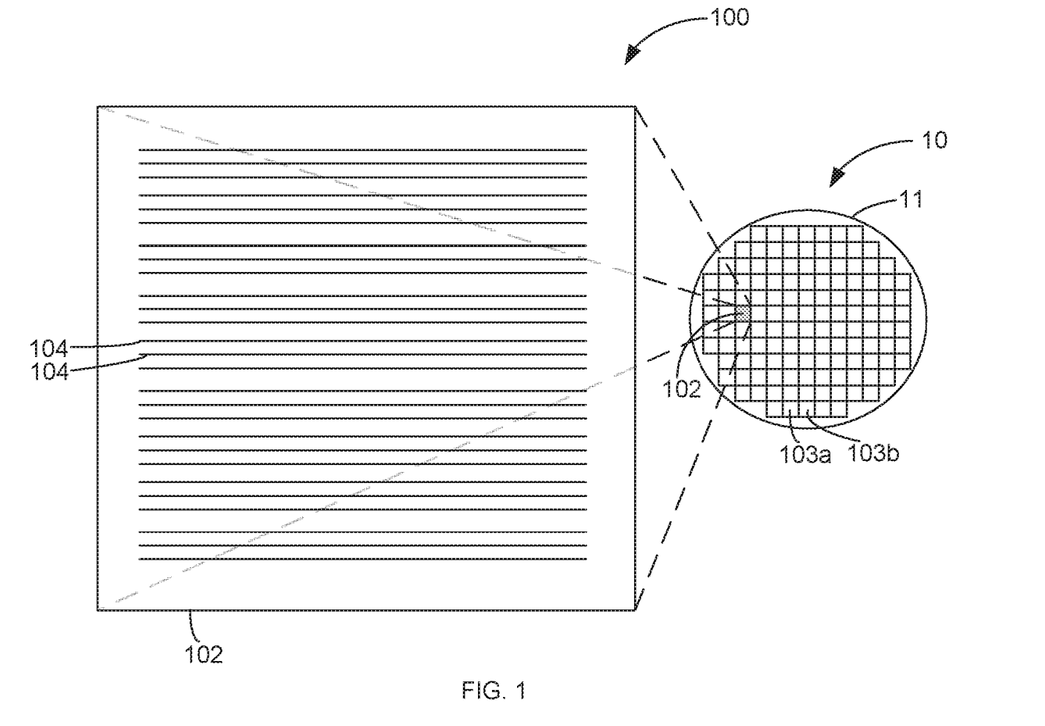
FIG. 1 schematically illustrates a top view of an example die in wafer form and in singulated form, in accordance with some embodiments.

FIG. 1 schematically illustrates a top view of an example die 102 in wafer form 10 and in singulated form 100, in accordance with some embodiments. In some embodiments, the die 102 may be one of a plurality of dies (e.g., dies 102, 103a, 103b) of a wafer 11 composed of semiconductor material such as, for example, silicon or other suitable material. The plurality of dies may be formed on a surface of the wafer 11. Each of the dies may be a repeating unit of a semiconductor product that may include one or more active circuit devices that may be formed FEOL (front end of line), which may be underneath one or more non-planar gate thin film transistors that may be formed BEOL (back end of line). The one or more transistors formed BEOL may include a transistor formed using process 900 (FIG. 9) or some other process described herein with reference to FIGS. 3-10.

The die 102 may include circuitry having transistor structures 104 such as, for example, one or more channel bodies (e.g., fin structures, nanowires, planar bodies, etc.) that provide a channel pathway for mobile charge carriers of one or more transistor devices or source/drain regions. Transistor electrode assemblies (e.g., terminal contacts) may be formed on and coupled with the one or more transistor structures 104 to route electrical energy to or from the transistor structures 104. For example, terminal contacts may be electrically coupled with a channel body to provide a gate electrode for delivery of a threshold voltage and/or a source/drain current to provide mobile charge carriers for operation of a transistor device. Although the transistor structures 104 are depicted in rows that traverse a substantial portion of the die 102 in FIG. 1 for the sake of simplicity, it is to be understood that the transistor structures 104 may be configured in any of a wide variety of other suitable arrangements on the die 102 in other embodiments, including, for example, vertical and horizontal features having much smaller dimensions than depicted.

After a fabrication process of the semiconductor product embodied in the dies is complete, the wafer 11 may undergo a singulation process in which each of the dies (e.g., die 102) is separated from one another to provide discrete "chips" of the semiconductor product. The wafer 11 may be any of a variety of sizes. In some embodiments, the wafer 11 has a diameter ranging from about 25.4 mm to about 450 mm. The wafer 11 may include other sizes and/or other shapes in other embodiments. According to various embodiments, the transistor structures 104 may be disposed on a semiconductor substrate in wafer form 10 or singulated form 100. The transistor structures 104 described herein may be incorporated in a die 102 for logic or memory, or combinations thereof. In some embodiments, the transistor structures 104 may be part of a system-on-chip (SoC) assembly.

Figure 2:
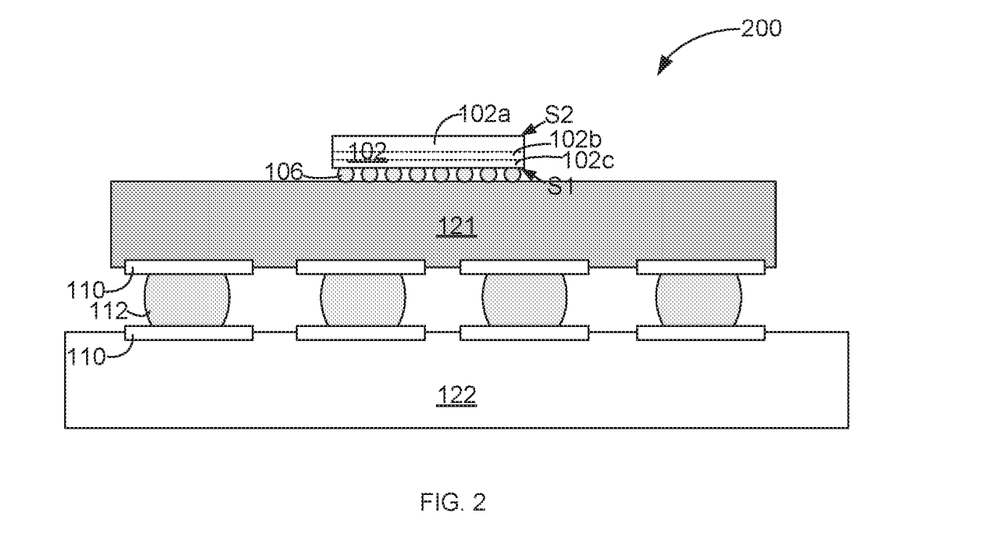
FIG. 2 schematically illustrates a cross-section side view of an integrated circuit (IC) assembly, in accordance with some embodiments.

FIG. 2 schematically illustrates a cross-section side view of an IC assembly 200, in accordance with some embodiments. In some embodiments, the IC assembly 200 may include one or more dies (hereinafter "die 102") electrically and/or physically coupled with a package substrate 121. In some embodiments, the package substrate 121 may be electrically coupled with a circuit board 122, as can be seen.

In some embodiments, an IC assembly 200 may include one or more of the die 102, package substrate 121 and/or circuit board 122, according to various embodiments. Embodiments described herein for an IC structure may be implemented in any suitable IC device according to various embodiments.

The die 102 may represent a discrete product made from a semiconductor material (e.g., silicon) using semiconductor fabrication techniques such as thin film deposition, lithography, etching and the like used in connection with forming CMOS devices. In some embodiments, the die 102 may be, include, or be a part of a processor, memory, SoC or ASIC. In some embodiments, an electrically insulative material such as, for example, molding compound or underfill material (not shown) may encapsulate at least a portion of the die 102 and/or die-level interconnect structures 106.

The die 102 can be attached to the package substrate 121 according to a wide variety of suitable configurations including, for example, being directly coupled with the package substrate 121 in a flip-chip configuration, as depicted. In the flip-chip configuration, an active side, S1, of the die 102 including circuitry is attached to a surface of the package substrate 121 using die-level interconnect structures 106 such as bumps, pillars, or other suitable structures that may also electrically couple the die 102 with the package substrate 121. The active side S1 of the die 102 may include active devices such as, for example, transistor devices. An inactive side, S2, may be disposed opposite to the active side S1, as can be seen.

The die 102 may generally include a semiconductor substrate 102a, one or more device layers (hereinafter "device layer 102b") and one or more interconnect layers (hereinafter "interconnect layer 102c"). The semiconductor substrate 102a may be substantially composed of a bulk semiconductor material such as, for example silicon, in some embodiments.

The device layer 102b may represent a region where active devices such as transistor devices are formed on the semiconductor substrate. The device layer 102b may include, for example, transistor structures such as channel bodies and/or source/drain regions of transistor devices. The interconnect layer 102c may include interconnect structures that are configured to route electrical signals to or from the active devices in the device layer 102b. For example, the interconnect layer 102c may include horizontal lines (e.g., trenches) and/or vertical plugs (e.g., vias) or other suitable features to provide electrical routing and/or contacts.

In some embodiments, the die-level interconnect structures 106 may be electrically coupled with the interconnect layer 102c and configured to route electrical signals between the die 102 and other electrical devices. The electrical signals may include, for example, input/output (I/O) signals and/or power/ground signals that are used in connection with operation of the die 102.

In some embodiments, the package substrate 121 is an epoxy-based laminate substrate having a core and/or build-up layers such as, for example, an Ajinomoto Build-up Film (ABF) substrate. The package substrate 121 may include other suitable types of substrates in other embodiments including, for example, substrates formed from glass, ceramic, or semiconductor materials.

The package substrate 121 may include electrical routing features configured to route electrical signals to or from the die 102. The electrical routing features may include, for example, pads or traces (not shown) disposed on one or more surfaces of the package substrate 121 and/or internal routing features (not shown) such as, for example, trenches, vias or other interconnect structures to route electrical signals through the package substrate 121. For example, in some embodiments, the package substrate 121 may include electrical routing features such as pads (not shown) configured to receive the respective die-level interconnect structures 106 of the die 102.

The circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. Interconnect structures (not shown) such as traces, trenches, or vias may be formed through the electrically insulating layers to route the electrical signals of the die 102 through the circuit board 122. The circuit board 122 may be composed of other suitable materials in other embodiments. In some embodiments, the circuit board 122 is a motherboard (e.g., motherboard 1002 of FIG. 6).

Package-level interconnects such as, for example, solder balls 112 may be coupled to one or more pads (hereinafter "pads 110") on the package substrate 121 and/or on the circuit board 122 to form corresponding solder joints that are configured to further route the electrical signals between the package substrate 121 and the circuit board 122. The pads 110 may be composed of any suitable electrically conductive material such as metal including, for example, nickel (Ni), palladium (Pd), gold (Au), silver (Ag), copper (Cu), and combinations thereof. Other suitable techniques to physically and/or electrically couple the package substrate 121 with the circuit board 122 may be used in other embodiments.

The IC assembly 200 may include a wide variety of other suitable configurations in other embodiments including, for example, suitable combinations of flip-chip and/or wire-bonding configurations, interposers, multi-chip package configurations including system-in-package (SiP) and/or package-on-package (PoP) configurations. Other suitable techniques to route electrical signals between the die 102 and other components of the IC assembly 200 may be used in some embodiments.

Figure 3:
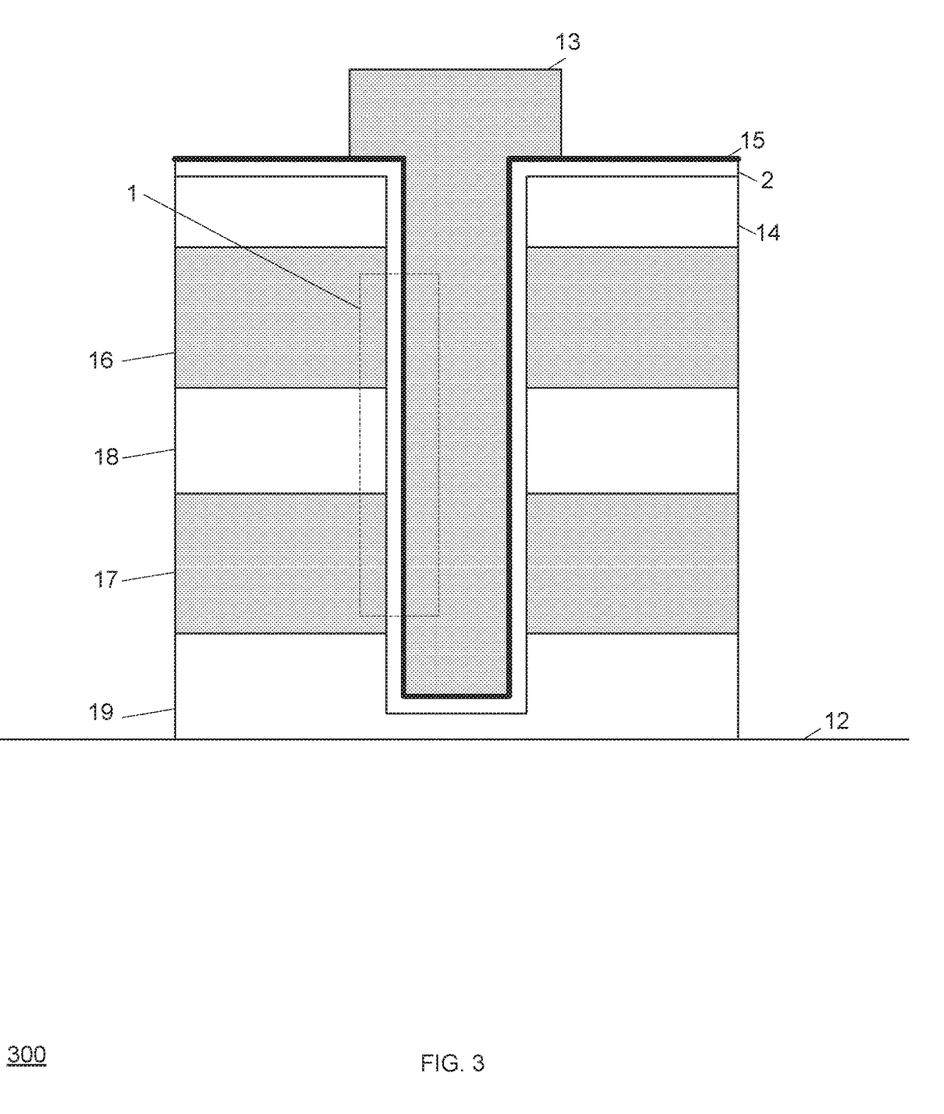
FIG. 3 schematically illustrates a cross-section side view of an integrated circuit including a non-planar gate thin film transistor, in accordance with some embodiments.

FIG. 3 schematically illustrates a cross-section side view of an integrated circuit 300 including a non-planar gate thin film transistor 1, in accordance with some embodiments. The non-planar (e.g., vertical) gate thin film transistor 1 may include a semiconductive layer 2 and a gate dielectric layer 15 formed on a sidewall of one or more layers formed on a substrate 12. The one or more layers may include a first electrode 17 (e.g., a conductive layer), an inter-layer dielectric (ILD) 18 formed on the first electrode, and a second electrode 16 (e.g.; a conductive layer) formed on the ILD 18. In some embodiments, first electrode 17 may be the source, and second electrode 16 may be the drain. In other embodiments, first electrode 17 may be the drain, and second electrode 16 may be the source. A gate 13 may be formed in contact, e.g.; in direct contact, with the gate dielectric layer 15.

In some examples, the semiconductive layer 2 and a gate dielectric layer 15 formed thereon may be disposed in a hole in the one or more layers. The gate 13 may be a conductive material filling the hole. The semiconductive layer 2 may wrap around the gate 13, e.g., surround the gate 13 on all sides of the hole. In some embodiments, the semiconductive layer 2 may also be disposed in the hole below the gate 13; however, this is not required. The wrap-around structure may increase the effective width (hence current drive and performance) as compared to a planar gate thin film transistor where current flow may be through a rectangular sheet of charge. The integrated circuit 300 may have an improved lateral area to performance ratio as compared to an integrated circuit based on a planar gate thin film transistor.

Figure 4:
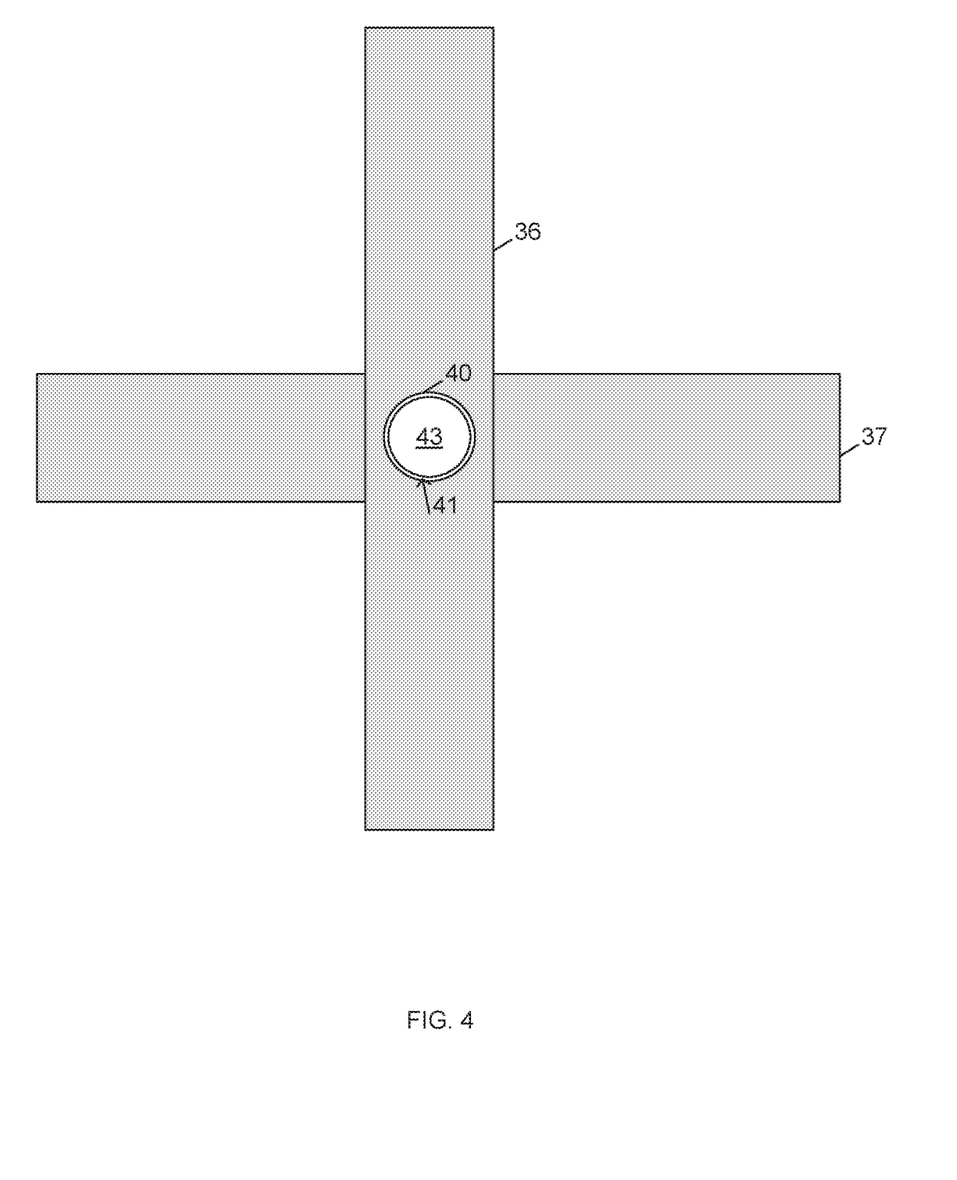
FIG. 4 schematically illustrates a top view of the hole, a source, and a drain for another integrated circuit including a non-planar gate thin film transistor, in accordance with some embodiments.

In some examples, the hole may have rounded sidewalls (the portion of the gate 13 filling the hole may have cylindrical sidewalls). FIG. 4, which will be described later in greater detail, illustrates a top view of a hole 40 with rounded sidewalls in another example. Referring again to FIG. 3, current flow may be non-parallel (e.g., vertical, such as orthogonal to the substrate 12), and through a circular cross-section. This may be in contrast to a planar gate thin film transistor where current flow may be parallel to a substrate and through a rectangular sheet of charge. Current flow through a circular cross-section may provide a greater area of conduction (hence current drive and performance). With a circular cross-section; $I_{ON}$ of the non-planar thin film transistor 1 may be a product of a width of the gate 13 and a factor of Pi ($\pi$), which may provide faster charge storage than some planar gate thin film transistors. $I_{ON}$ refers to a threshold current to flow through the channel region when the transistor is in an on state. The width of the gate 13 refers to a thickness of the gate 13 measured on an axis parallel to a surface of the substrate 12, in this example.

The gate 13 may be shared by more than one non-planar gate thin film transistor (e.g., transistors next to each other in a same plane may share a same gate). For example, the gate 13 may be shared by non-planar gate thin film transistor 1 and another non-planar gate thin film transistor that is on another side of the hole and in a same plane parallel to a surface of the substrate 12. Also, in other examples, the gate 13 may be shared by non-planar gate thin film transistor 1 and another non-planar gate thin film transistor on a same side of the hole in a plane that is orthogonal to a surface of the substrate 12. Current flow of each of more than one non-planar gate thin film transistor of a shared gate 13 may be through different regions of the gate 13. The sharing of the gate 13 may be based on a characteristic of thin film transistors having a lower OFF state leakage than transistors formed on a substrate of semiconductor material. In some examples, shared gate/accumulation may enable a higher $I_{ON}$, which may be useful in driving loads faster in a memory application.

In some examples, at least one layer, e.g., an insulating layer 19, may be between the substrate 12 and the one or more layers on the substrate 12. In some examples, a wire (not shown, e.g., a wire for a word line) may be formed on the substrate 12, and the insulating layer 19 may be formed on the wire. In some examples, the hole may penetrate, e.g., partially penetrate, the insulating layer 19, and the gate 13 in the hole may make contact with the wire for gate access from below the non-planar gate thin film transistor 1. For gate access from above the non-planar gate thin film transistor 1, a dielectric layer 14 may be formed on the one or more layers, and a contact of the gate 13 (for electrical coupling to a wire) may be over a portion of the dielectric layer 14.

The semiconductive layer 2 may be an amorphous semiconductor, a polycrystalline semiconductor, a chalcogenide, a semiconductive oxide, or the like, or combinations thereof. In some examples, the semiconductive layer 2 may include thin channel transistor materials such as $SnO_2$, SnO, CoO, IGZO, ZnO, CuO, $Cu_2O$, ITO, IZO, NiO, InO, GaO, Ge (e.g., amorphous or polycrystalline), Si (e.g., amorphous or polycrystalline), or the like, or combinations thereof.

In some examples, the semiconductive layer 2 may be doped with one or more metals. Dopants may increase bandgap states and subsequently increase the on state current. The dopant may be a metal dopant such as As, InAs, Tl, Ta, Ti, Hf, Mn, MnCu, Cu, W, Pt, or the like, or combinations thereof.

The first electrode 17, the second electrode 16, and the gate 13 may be made from the same or different conductive material, e.g., the same or different metal. In some examples, a plasma treatment may be applied to the first electrode 17 and/or the second electrode 16 prior to deposition of the semiconductive layer 2. The plasma treatment may dope the first electrode 17 and/or the second electrode 16, which may result in a greater $I_{ON}$ for the non-planar gate thin film transistor 1 (which may be used in combination with a long channel length (Lg) that may provide low leakage and/or low $I_{OFF}$). $I_{OFF}$ refers to current that flows through the channel region when the transistor is in an off state. The gate dielectric layer 15, ILD 18, the insulating layer 19, and the dielectric layer 14 may be made from the same or different dielectric materials.

The substrate 12 may be made from any material, including one or more non-conductive or semiconductive materials as previously mentioned. In some embodiments, as previously mentioned, substrate 12 may include active circuit devices (e.g., one or more active circuit devices formed in a silicon substrate, e.g., formed FEOL). The substrate 12 may form an active layer (e.g., channel) of the active circuit devices that are formed in the substrate 12. In examples where the substrate 12 may include active circuit devices, the insulating layer 19 may provide insulation between the first electrode 17 and the active circuit devices formed in the substrate 12. The active circuit devices formed in substrate 12 may include one or more transistors, and the substrate 12 may include a semiconductor material.

In some examples, non-planar gate thin film transistor 1 may correspond to a memory cell of a memory array, and the active circuit devices formed in the substrate 12 may be part of peripheral circuitry of the memory array (e.g., circuitry of the memory array apart from the memory cells, including but not limited to sense/write circuitry). Therefore, the integrated circuits of memory cells of the memory array may be formed above (e.g., formed BEOL) the active circuit devices of the peripheral circuitry (which may be formed FEOL). This may be in contrast to some memory arrays where active circuit devices of the peripheral circuitry are formed on a same planar substrate as active circuit devices of the memory cells. Whereas array efficiency in some memory arrays where active circuit devices of the peripheral circuitry are formed on a same planar substrate may not exceed 60%, the array efficiency of memory arrays disclosed herein may be greater than 60%, and in some cases may approach and/or reach 100%. Array efficiency may be the ratio of area taken up by the memory array divided by the total area of the memory system (which includes the peripheral sensing and driving circuitry, in addition to the array).

The non-planar gate thin film transistor 1 may enable a longer channel length (which may be based on the thickness of include ILD 18 and/or a distance between the first electrode 17 and the second electrode 16) for a given substrate layout size than planar gate thin film transistors. The longer channel may result in lower leakage (e.g., lower $I_{OFT}$). Due to the lower leakage, the non-planar gate thin film transistor 1 may be more suited (than some planar gate thin film transistors) for use in a memory cell in a DRAM (dynamic random access memory) array. In particular, besides improved performance, power savings may be realized if the non-planar gate thin film transistor 1 is utilized for a volatile memory cell (e.g., due to the lower leakage, a refresh rate of the volatile memory may be lower). In some temporary data storage applications, such as caching, the lower leakage current may enable refreshing to be bypassed entirely.

Some GAA (gate all around) structures include an ungated region of a semiconductor (a region where the gate does not wrap around the semiconductor). In contrast to these GAA structures, the semiconductive layer 2 may wrap around the gate 13, and the semiconductive material 2 is in contact, e.g., direct contact, with an entire gate portion between the first and second electrodes 16 and 17. Therefore, the non-planar thin film transistor 1 may not include an ungated region, which may improve the off state leakage of the transistors.

FIG. 4 schematically illustrates a top view of the hole 40, a first electrode 37, and a second electrode 36, for an integrated circuit including a non-planar gate thin film transistor, in accordance with some embodiments. In some embodiments, the first electrode 37 may correspond to the first electrode 17 shown in FIG. 3, and the second electrode 36 may correspond to the second electrode 16 shown in FIG. 3. The hole 40 may correspond to the hole described with respect to FIG. 3 (e.g., in which the semiconductive material 2, gate dielectric 15, and gate 13 are formed). The semiconductive material 41 may correspond to the semiconductive material 2 shown in FIG. 3 and the gate 43 may correspond to the gate 13 shown in FIG. 3.

As shown in FIG. 4, only a portion of the second electrode 36 may be formed over the first electrode 37 in this example. For example, as shown in FIG. 4, the long axes of the source and drain may be oriented about ninety degrees with respect to one another and a portion of the source may overlap with a portion of the drain. In some examples, a same mask used to form the first electrode 37 may be rotated ninety degrees relative to the substrate and used for the second electrode 36, which may minimize masks/costs.

The hole 40 may be formed in this overlapping portion of the second electrode 36 and the first electrode 37. In this example, a gate/source/drain definition may be self-aligned (e.g., the mask that defines any two orthogonal lines (interconnects/wires), by the way of orthogonality, is self-aligned). Self-alignment may simplify processing steps and may require minimal masks. In examples where the substrate (FIG. 3) includes peripheral circuitry, the most difficult patterning processes associated with the most critical dimensions may be associated with the peripheral circuitry, and in silicon. In other examples, an entire portion of a first electrode 37 may be above a second electrode 36.

Figure 5:
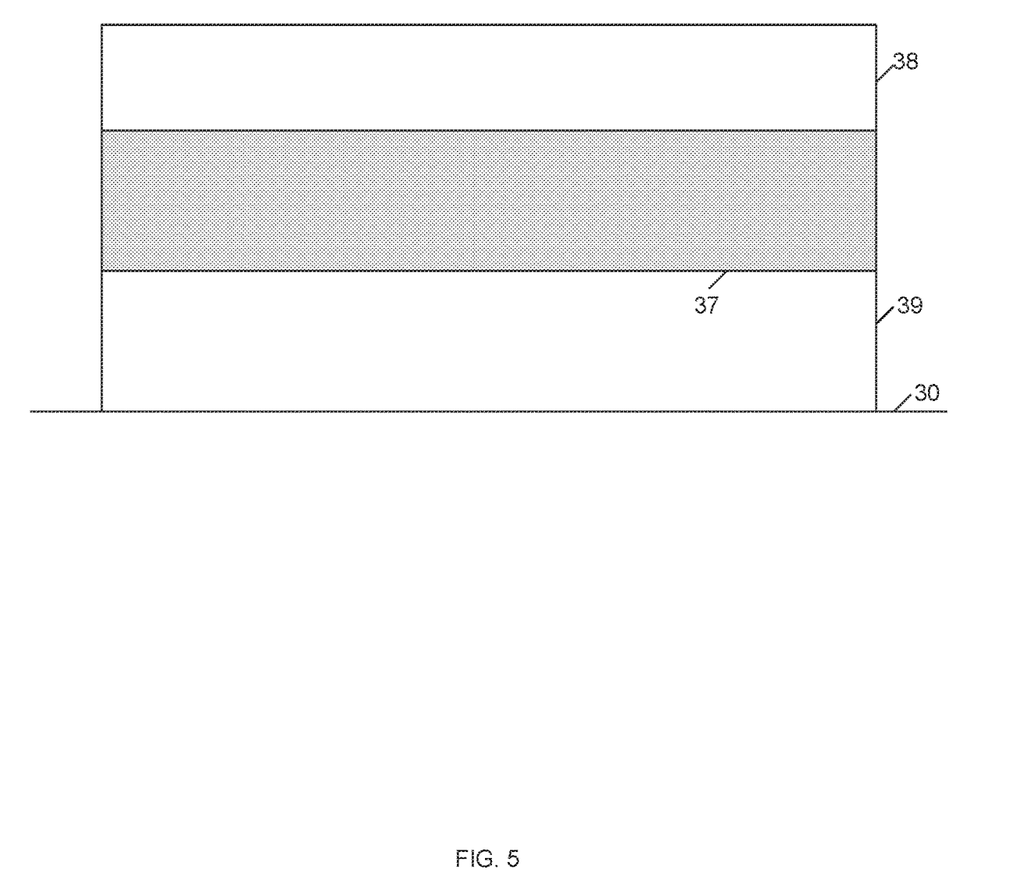
FIGS. 5-8 schematically illustrate cross-section side views of the formation of an integrated circuit that utilizes the hole, source, and drain of FIG. 4, in accordance with some embodiments.

FIGS. 5-8 schematically illustrate cross-section side views of the formation of an integrated circuit that utilizes the hole, source, and drain of FIG. 4, in accordance with some embodiments, Referring to FIG. 5, an insulating layer 39 may be deposited on a substrate 30 having a planar surface. A first electrode 37 may be patterned and formed on the insulating layer 39. In some embodiments, a bit line wire (not shown) in contact with the first electrode 37 may also be patterned. An ILD 38 may be deposited on the first electrode 37.

Figure 6:
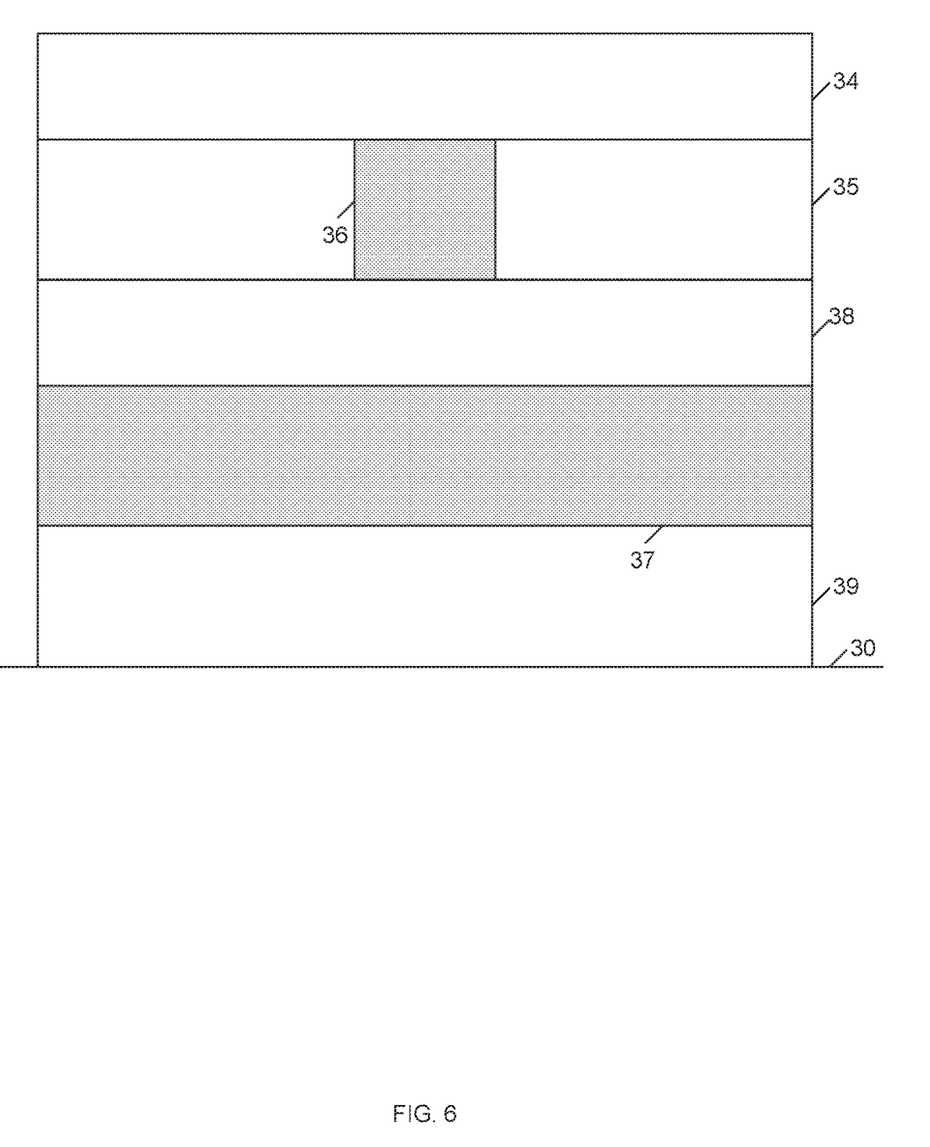

Referring to FIG. 6, the second electrode 36 may be patterned. A bit line wire (not shown) in contact with the second electrode 36 may also be patterned and formed on the ILD 38. A dielectric 35 that may be deposited on the ILD 38 for formation of the second electrode 36 (e.g., in the dielectric 35) is shown. A dielectric layer 34 may be deposited on the second electrode 36 and the dielectric 35 after formation of the second electrode 36.

Figure 7:
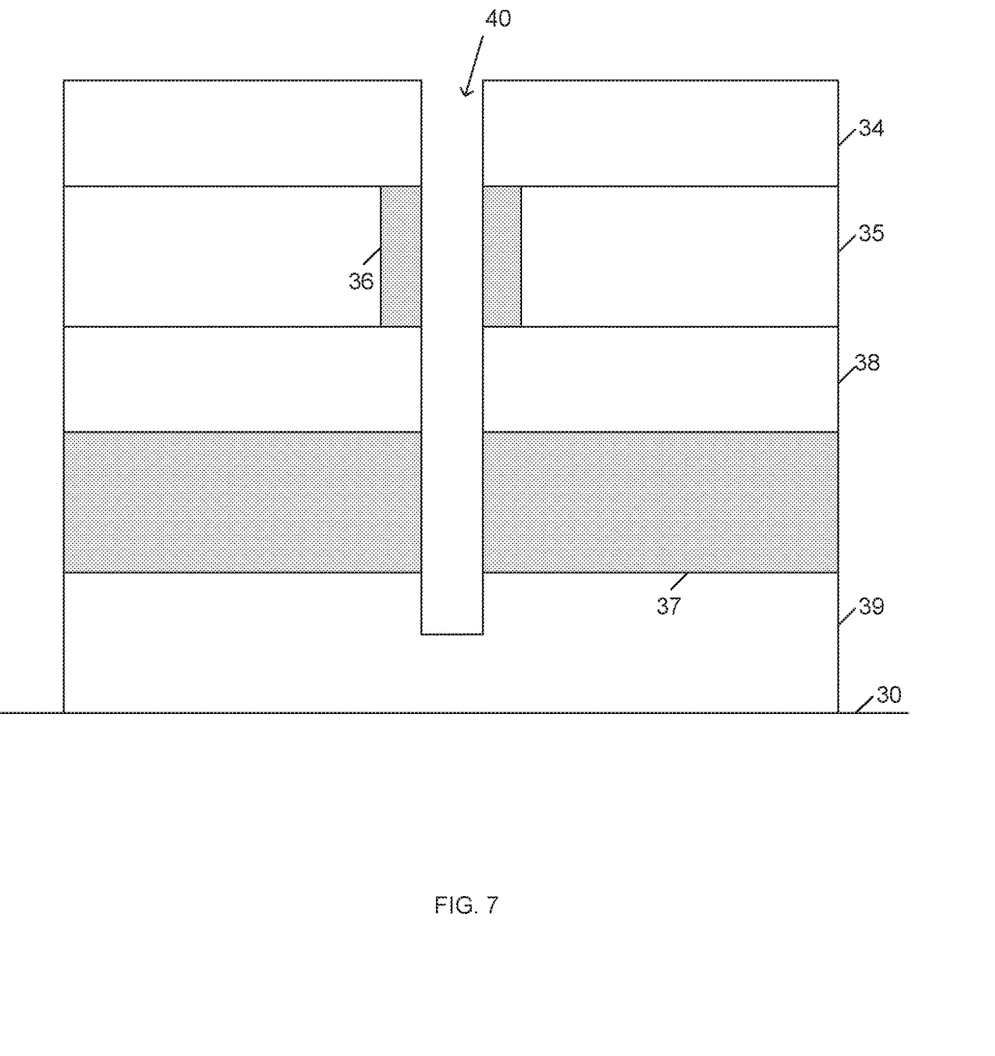

Referring to FIG. 7, a hole 40 may be formed (e.g., by dry etch and/or wet etch) through the dielectric layer 34, the second electrode 36, the ILD 38, and the first electrode 37. The hole 40 may extend into the insulating layer 39 (e.g., below the surface of the insulating layer 39 but above the surface of the substrate 30), Dry etch may be used in any example, including where the hole 40 exposes a gate access wire (not shown) formed on the substrate 30 prior to formation of the hole 40. Wet etch may be used in any example, such as in examples where a contact structure may be formed at the bottom of the hole 40.

Figure 8:
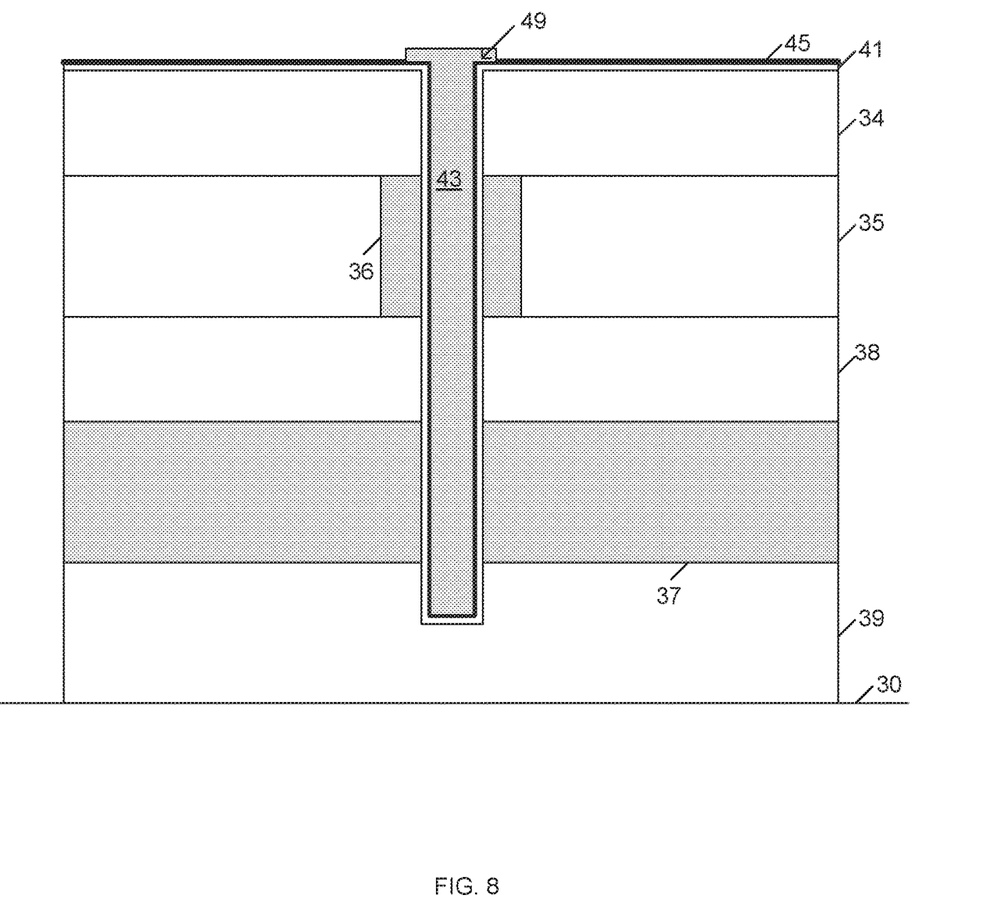

Referring to FIG. 8, a semiconductive layer 41 may be deposited on a sidewall of the hole 40 (FIG. 7). Depending on the aspect ratio, atomic layer deposition, chemical vapor deposition, physical vapor deposition, evaporation, sputtering, or the like, or combinations thereof, may be used. The semiconductive layer 41 may also be deposited on at least a portion of the top surface of the dielectric layer 34. A gate dielectric layer 45 may be deposited on the semiconductive layer 41. The dielectric material may be $HfO_2$, $TiO_2$, $Ta_2O_5$, $SiO_7$, SiN, or the like, or combinations thereof. The dielectric material may be deposited using atomic layer deposition, chemical vapor deposition, physical vapor deposition, sputtering, or the like, or combinations thereof.

After the deposition of the gate dielectric layer 45, the hole 40 (FIG. 7) may be filled with a conductive material to form the gate 43. For example, the gate dielectric layer 45 may cover the semiconductive layer 41 in the hole 40. In some examples, conductive material deposited above the dielectric layer 34 may be patterned to form the contact 49 for a gate access wire. For example, the contact 49 may extend laterally past the boundary of the hole 40.

Figure 9:
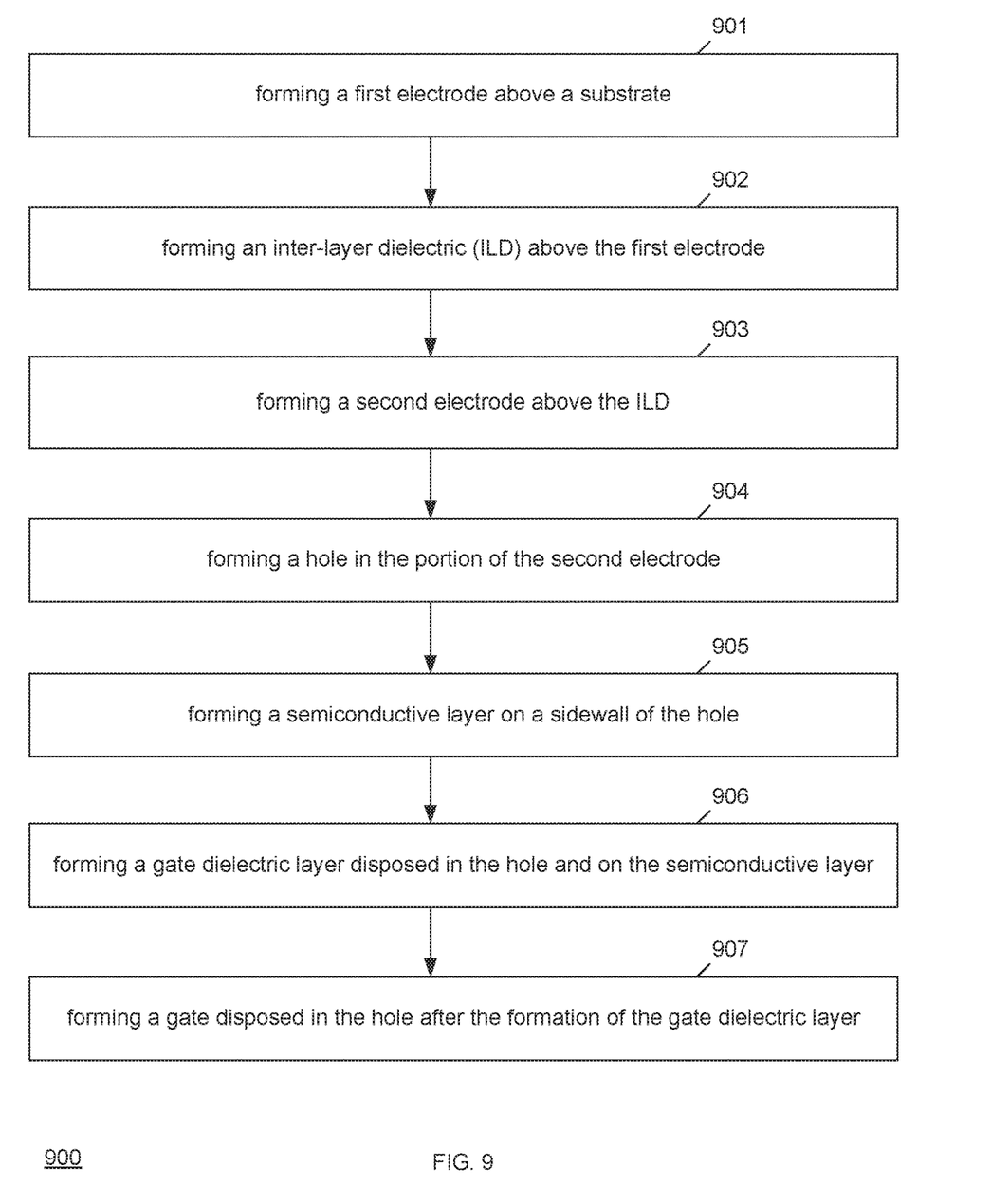
FIG. 9 is a flow diagram that illustrates a process for forming an integrated circuit including a non-planar gate thin film transistor, in accordance with some embodiments.

FIG. 9 is a flow diagram that illustrates a process for forming an integrated circuit including a non-planar gate thin film transistor, in accordance with some embodiments.

In block 901, a first electrode may be formed above a substrate. In block 902, an ILD may be formed above the first electrode. In block 903, a second electrode may be formed above the ILD, At least a portion of the second electrode may be formed over the first electrode.

In block 904, a hole may be formed in the portion of the second electrode, and the hole may extend through the second electrode and the first electrode. In block 905, a semiconductive layer may be formed on a sidewall of the hole. In block 906, a gate dielectric layer may be disposed in the hole and formed on the semiconductive layer. In block 907, a gate disposed in the hole may be formed after the formation of the gate dielectric layer.

Figure 10:
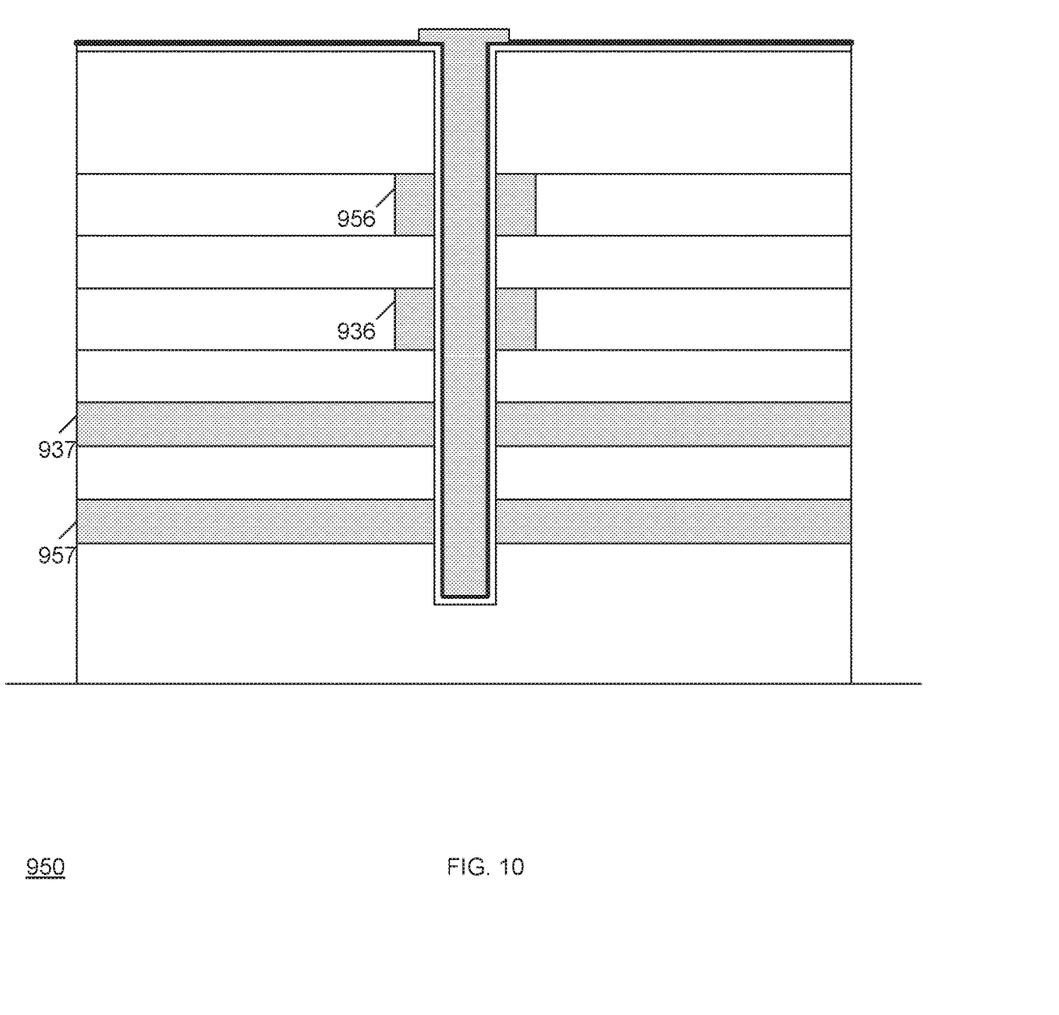
FIG. 10 schematically illustrates a cross-section side view of a non-planar gate thin film transistor based integrated circuit in a configuration for a programmable drive, in accordance with some embodiments.

FIG. 10 schematically illustrates a cross-section side view of a non-planar gate thin film transistor based integrated circuit 950 in a configuration for a programmable drive, in accordance with some embodiments. The integrated circuit 950 may include a count of N one or more drains and a count of k one or more sources. In the illustrated example, the N and k are both equal to two (a first electrode 937 and a second electrode 936 corresponding to source, and $drain_1$, and a first electrode 957 and a second electrode 956 corresponding to $source_N$ and $drain_N$), although in other examples N and k may be different values and/or may range from one to twenty or more.

In one example, any two of electrodes 936, 937, 956, and 957 can be selected to be the respective source/drain of a transistor (e.g., based on access needs). In some examples, the selection may be made dynamically by a control circuit. Non-selected ones of the electrodes 936, 937, 956, and 957 may be disconnected from a read/write circuitry, and/or may be held at a lower voltage, (e.g., floated). Depending on which drain/source is selected, a different channel length, and accordingly a different $I_{ON}$ may be utilized for the corresponding transistor. In other examples, the selection may be hard-wired during manufacturing.

In some examples, more than one source may be simultaneously selected to provide a lower contact resistance. For instance, referring to FIG. 10, more than one of the electrodes 936 and 956 may be selected and/or more than one of the electrodes 937 and 957 may be selected.

Figure 11:
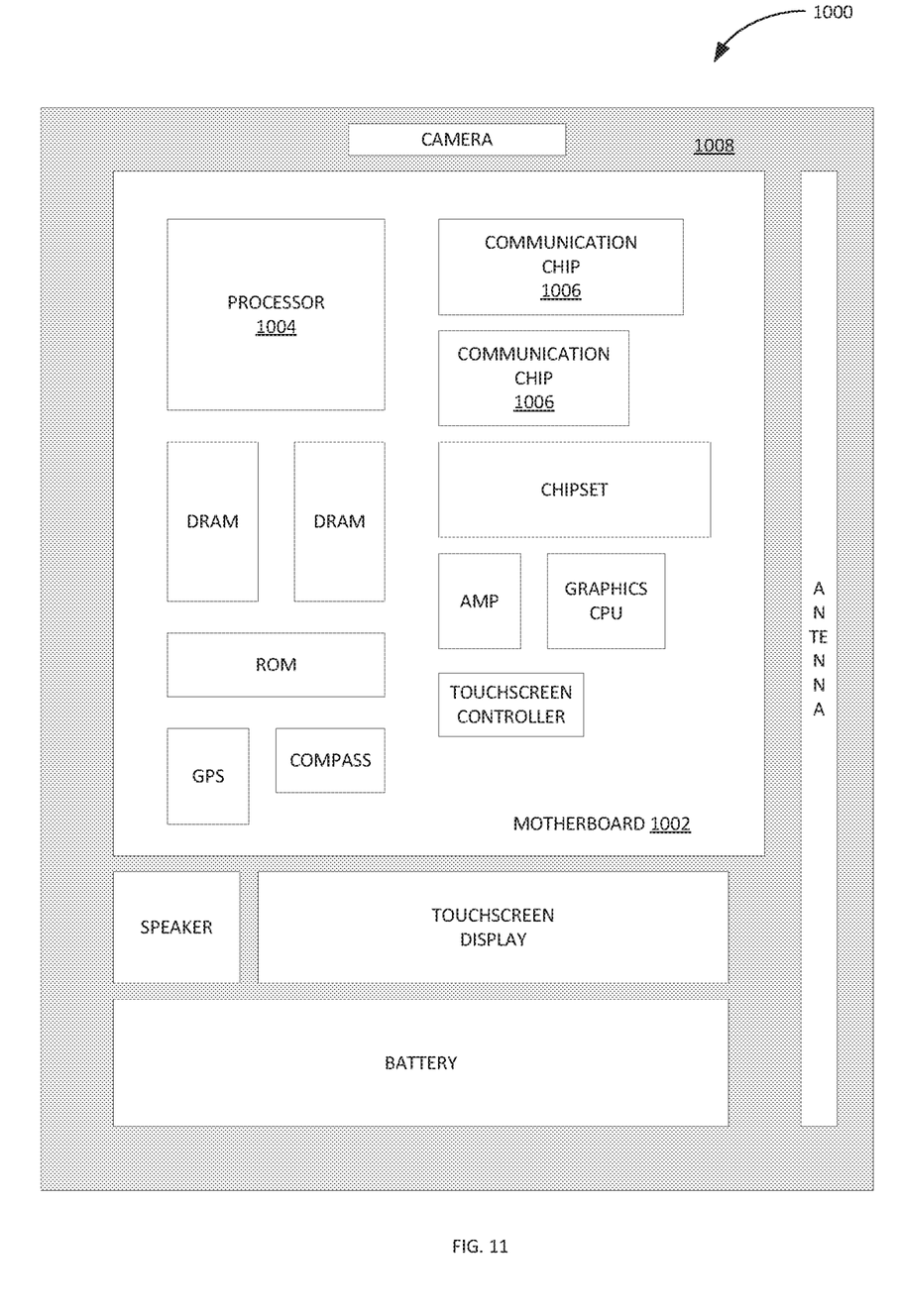
FIG. 11 schematically illustrates an example system that may include an IC device as described herein, in accordance with some embodiments.

FIG. 11 schematically illustrates an example system (e.g., computing device 1000) that may include an IC device including a non-planar gate thin film transistor (e.g., non-planar gate thin film transistor 300 and/or a non-planar gate thin film transistor formed using the process 900 or some other process described herein with reference to FIGS. 3-10. Components of the computing device 1000 may be housed in an enclosure (e.g., housing 1008). The motherboard 1002 may include a number of components, including but not limited to a processor 1004 and at least one communication chip 1006. The processor 1004 may be physically and electrically coupled to the motherboard 1002. In some implementations, the at least one communication chip 1006 may also be physically and electrically coupled to the motherboard 1002. In further implementations, the communication chip 1006 may be part of the processor 1004.

Depending on its applications, computing device 1000 may include other components that may or may not be physically and electrically coupled to the motherboard 1002. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1006 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible broadband wireless access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1006 may operate in accordance with a Global System for Mobile Communication (GSM), General Packet Radio Service (CPRS), Universal Mobile Telecommunications System (UMTS), High Speed Packet Access (HSPA), Evolved HSPA (E-HSPA), or LTE network. The communication chip 1006 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1006 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1006 may operate in accordance with other wireless protocols in other embodiments.

The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, EV-DO, and others.

The processor 1004 and/or any memory of the computing device 1000 may include a die (e.g., die 102 of FIG. 1 and FIG. 2) including the IC and/or non-planar gate thin film transistor described herein (e.g., non-planar gate thin film transistor 1, IC 300, and/or a non-planar gate thin film transistor using the process 900 or any process described herein with reference to FIGS. 3-10) as described herein. In some examples, a cache (not shown) of the processor 1004 may include a die (e.g., die 102 of FIG. 1 and FIG. 2) including the IC and/or non-planar gate thin film transistor described herein. In some embodiments, the die of the processor 1004 may further include active circuit devices formed FEOL in a substrate, and the non-planar gate thin film transistors described herein may be formed BEOL above the FEOL devices. In some embodiments, the die 102 of FIG. 2 may be mounted in a package assembly (e.g., package assembly 200) that is mounted on a circuit board such as the motherboard 1002, The term "processor" may refer to any device or portion of a device that processes electronic data from registers and/or memory to transform that electronic data into other electronic data that may be stored in registers and/or memory.

The communication chip 1006 may also include a die (e.g., die 102) including the IC and/or non-planar gate thin film transistor described herein (e.g., non-planar gate thin film transistor 1, IC 300 and/or a non-planar gate thin film transistor using the process 900 or any process described herein with reference to FIGS. 3-10) as described herein. In some embodiments, the die of the communication chip 1006 may further include active circuit devices formed FEOL in a substrate, and the non-planar gate thin film transistors described herein may be formed BEOL above the FEOL devices. In further implementations, another component (e.g., memory device or other integrated circuit device) housed within the computing device 1000 may contain a die (e.g., die 102) including the IC and/or non-planar gate thin film transistor described herein (e.g., non-planar gate thin film transistor 1, IC 300, and/or a non-planar gate thin film transistor using the process 900 or any process described herein with reference to FIGS. 3-10) as described herein.

In various implementations, the computing device 1000 may be a mobile computing device, a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Some non-limiting examples of various embodiments are provided below.

Example 1 is an integrated circuit, comprising: a plurality of layers formed on a substrate, the plurality of layers including a first one of a source or drain, an inter-layer dielectric (ILD) formed on the first one of the source or drain, and a second one of the source or drain formed on the ILD; a semiconductive layer formed on a sidewall of the plurality of layers; a gate dielectric layer formed on the semiconductive layer; and a gate formed in contact with the gate dielectric layer.

Example 2 may include the subject matter of example 1, and the sidewall of the plurality of layers comprises a sidewall of a hole formed in the plurality of layers.

Example 3 may include the subject matter of any of examples 1-2, and the gate dielectric layer and the gate are disposed in the hole, and wherein the semiconductive layer formed on the sidewall of the hole surrounds a side surface of the gate.

Example 4 may include the subject matter of any of examples 1-3, and the sidewall of the hole is rounded.

Example 5 may include the subject matter of any of examples 1-4, and the semiconductive layer comprises at least one of an amorphous semiconductor, a polycrystalline semiconductor, a chalcogenide, or a semiconductive oxide.

Example 6 may include the subject matter of any of examples 1-5, and the semiconductive material comprises at least one of $SnO_2$, SnO, CoO, IGZO, ZnO, CuO, $Cu_2O$, ITO, IZO, NiO, InO, GaO, Ge or Si.

Example 7 may include the subject matter of any of examples 1-6, and the semiconductive layer is doped with one or more metals.

Example 8 may include the subject matter of any of examples 1-7, and only a portion of the second one of the source or drain is formed over the first one of the source or drain in the plurality of layers.

Example 9 may include the subject matter of any of examples 1-8, and at least one of the source or drain is doped.

Example 10 may include the subject matter of any of examples 1-10, and the substrate comprises peripheral circuitry.

Example 11 is an integrated circuit, comprising: a substrate; and a first one of a source or drain formed above the substrate; a second one of the source or drain formed above the first one of the source or drain; and a hole formed through the first one of the source or drain and the second one of the source or drain; and a semiconductive layer formed on a sidewall of the hole.

Example 12 may include the subject matter of example 11, and the semiconductive layer comprises a shared channel layer for a plurality of transistors.

Example 13 may include the subject matter of any of examples 11-12, and the semiconductive layer comprises at least one of an amorphous semiconductor, a polycrystalline semiconductor, a chalcogenide, or a semiconductive oxide.

Example 14 may include the subject matter of any of examples 11-13, and the first one of the source or drain is formed on a different source or drain, and a second one of the different source or drain is formed on the other one of the different source or drain.

Example 15 may include the subject matter of any of examples 11-14, and the semiconductive layer is orthogonal to a planar surface of the substrate.

Example 16 is a system, comprising: a processor; and at least one of a network device; a display, or a memory coupled to the processor; wherein the processor includes an integrated circuited circuit, the integrated circuit including: a plurality of layers formed on a substrate; the plurality of layers including a first one of a source or drain, an inter-layer dielectric (ILD) formed on the first one of the source or drain; and a second one of the source or drain formed on the ILD; a semiconductive layer formed on a sidewall of the plurality of layers; and a gate dielectric layer formed on the semiconductive layer; and a gate formed in contact with the gate dielectric layer.

Example 17 may include the subject matter of example 16, and at least one of the source or drain is doped.

Example 18 may include the subject matter of any of examples 16-17, and the substrate comprises peripheral circuitry.

Example 19 may include the subject matter of any of examples 16-18, and only a portion of the second one of the source or drain is formed over the first one of the source or drain in the plurality of layers.

Example 20 may include the subject matter of any of examples 16-19, and the semiconductive layer comprises at least one of an amorphous semiconductor; a polycrystalline semiconductor; a chalcogenide, or a semiconductive oxide.

Example 21 is a method of producing an integrated circuit, the method comprising: forming a first one of a source or drain above a substrate; forming an inter-layer dielectric (ILD) above the first one of the source or drain; forming a second one of the source or drain above the ILD, wherein at least a portion of the second one of the source or drain is formed over the first one of the source or drain; forming a hole in the portion of the second one of the source or drain; forming a semiconductive layer on a sidewall of the hole; forming a gate dielectric layer disposed in the hole and on the semiconductive layer; and forming a gate disposed in the hole after the formation of the gate dielectric layer.

Example 22 may include the subject matter of example 21, and a sidewall of the hole is circular.

Example 23 may include the subject matter of any of examples 21-22, and forming the gate in the hole after formation of the gate dielectric layer further comprises filling the hole with conductor.

Example 24 may include the subject matter of any of examples 21-23, and the semiconductive layer comprises at least one of an amorphous semiconductor, a polycrystalline semiconductor, a chalcogenide, or a semiconductive oxide.

Example 25 may include the subject matter of any of examples 21-24, and forming FEOL (front-end-of-line) circuitry, wherein the substrate comprises said FEOL circuitry; wherein forming the first one of the source or drain, the ILD, the second one of the source or drain, and the hole comprises only BEOL (back-end-of-line) processes.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit, comprising:
a plurality of layers formed on a substrate, the plurality of layers including a first conductor material layer comprising a first one of a source or drain, an inter-layer dielectric (ILD) formed on the first conductor material layer, and a second conductor material layer formed on the ILD, the second conductor material layer comprising a second one of the source or drain;
a semiconductive layer formed on a sidewall of the plurality of layers, including on a sidewall of the first conductor material layer, a sidewall of the ILD, and a sidewall of the second conductor material layer;
a gate dielectric layer formed on the semiconductive layer; and
a gate formed in contact with the gate dielectric layer;
wherein the semiconductive layer fully wraps around a portion of the gate that is located in a hole, the semiconductive layer including a cylindrical interior surface and a cylindrical exterior surface, wherein the first conductor material layer, the second conductor material layer, and the gate are made of a same metal material.

2. The integrated circuit of claim 1, wherein the hole is formed in the plurality of layers, and wherein the sidewall of the plurality of layers comprises a sidewall of the hole.

3. The integrated circuit of claim 2, wherein the sidewall of the hole is rounded.

4. The integrated circuit of claim 1, wherein the semiconductive layer comprises at least one of an amorphous semiconductor, a polycrystalline semiconductor, a chalcogenide, or a semiconductive oxide.

5. The integrated circuit of claim 1, wherein the semiconductive layer comprises at least one of $SnO_2$, SnO, CoO, IGZO, ZnO, CuO, $Cu_2O$, ITO, IZO, NiO, InO, GaO, Ge or Si.

6. The integrated circuit of claim 1, wherein the semiconductive layer is doped with one or more metals.

7. The integrated circuit of claim 1, wherein only a portion of the second conductor material layer comprising the second one of the source or drain is formed over the first conductor material layer comprising the first one of the source or drain in the plurality of layers.

8. The integrated circuit of claim 1, wherein the substrate comprises peripheral circuitry.

9. An integrated circuit, comprising:
a substrate;
a first conductor material layer comprising a first one of a source or drain formed above the substrate;
a second conductor material layer comprising a second one of the source or drain, the second conductor material layer formed above the first conductor material layer comprising the first one of the source or drain;
an inter-layer dielectric (ILD) located between the first and second conductor material layers;
a hole formed through the first conductor material layer comprising the first one of the source or drain, the ILD, and the second conductor material layer comprising the second one of the source or drain; and
a semiconductive layer formed on a sidewall of the hole, including on a sidewall of the first conductor material layer, a sidewall of the ILD, and a sidewall of the second conductor material layer, wherein the semiconductor layer includes a curved interior surface facing a trench gate located in the hole and curved exterior surface facing the sidewall of the hole, wherein the first conductor material layer, the second conductor material layer, and the trench gate are made of a same metal material.

10. The integrated circuit of claim 9, wherein the semiconductive layer comprises a shared channel layer for a plurality of transistors.

11. The integrated circuit of claim 9, wherein the semiconductive layer comprises at least one of an amorphous semiconductor, a polycrystalline semiconductor, a chalcogenide, or a semiconductive oxide.

12. The integrated circuit of claim 9, wherein the first one of the source or drain is formed on one of a different source or drain, and a second one of the different source or drain is formed on the other one of the different source or drain.

13. The integrated circuit of claim 9, wherein the semiconductive layer is orthogonal to a planar surface of the substrate.

14. A system, comprising:
a processor; and
at least one of a network device, a display, or a memory coupled to the processor;
wherein the processor includes an integrated circuit, the integrated circuit including:
a plurality of layers formed on a substrate, the plurality of layers including a first conductor material layer comprising a first one of a source or drain, an inter-layer dielectric (ILD) formed on the first conductor material layer, and a second conductor material layer formed on the ILD, the second conductor material layer comprising a second one of the source or drain;
a semiconductive layer formed on a sidewall of the plurality of layers, including on a sidewall of the first conductor material layer, a sidewall of the ILD, and a sidewall of the second conductor material layer;
a gate dielectric layer formed on the semiconductive layer; and
a trench gate formed in contact with the gate dielectric layer, wherein said semiconductor layer fully wraps around a portion of the trench gate, wherein the first conductor material layer, the second conductor material layer, and the trench gate are made of a same metal material.

15. The system of claim 14, wherein the substrate comprises peripheral circuitry.

16. The system of claim 14, wherein only a portion of the second one of the source or drain is formed over the first one of the source or drain in the plurality of layers.

17. The system of claim 14, wherein the semiconductive layer comprises at least one of an amorphous semiconductor, a polycrystalline semiconductor, a chalcogenide, or a semiconductive oxide.

18. A method of producing an integrated circuit, the method comprising:
forming a first conductor material layer comprising a first one of a source or drain above a substrate;
forming an inter-layer dielectric (ILD) above the first conductor material layer comprising the first one of the source or drain;
forming a second conductor material layer comprising a second one of the source or drain above the ILD, wherein at least a portion of the second conductor material layer comprising the second one of the source or drain is formed over the first conductor material layer comprising the first one of the source or drain;
forming a hole in the portion of the second conductor material layer comprising the second one of the source or drain;
forming a semiconductive layer on a sidewall of the hole, including on a sidewall of the first conductor material layer, a sidewall of the ILD, and a sidewall of the second conductor material layer; and
forming a gate structure in the hole, the gate structure including a gate dielectric layer disposed in the hole and on the semiconductive layer and a gate disposed on the gate dielectric layer;
wherein said semiconductor layer fully wraps around a portion of the gate structure, wherein the first conductor material layer, the second conductor material layer, and the gate are made of a same metal material.

19. The method of claim 18, wherein a sidewall of the hole is circular.

20. The method of claim 19, wherein the gate is formed in the hole after formation of the gate dielectric layer, and wherein the method further comprises filling the hole with the metal material to form the gate.

21. The method of claim 18, wherein the semiconductive layer comprises at least one of an amorphous semiconductor, a polycrystalline semiconductor, a chalcogenide, or a semiconductive oxide.

22. The method of claim 18, further comprising:
forming FEOL (front-end-of-line) circuitry, wherein the substrate comprises said FEOL circuitry;
wherein forming the first one of the source or drain, the ILD, the second one of the source or drain, and the hole comprises only BEOL (back-end-of-line) processes.

* * * * *